(12) United States Patent
Hauenstein et al.

(10) Patent No.: US 8,102,668 B2
(45) Date of Patent: Jan. 24, 2012

(54) SEMICONDUCTOR DEVICE PACKAGE WITH INTERNAL DEVICE PROTECTION

(75) Inventors: Henning M. Hauenstein, Redondo Beach, CA (US); Alana Nakata, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 192 days.

(21) Appl. No.: 12/115,761

(22) Filed: May 6, 2008

(65) Prior Publication Data

US 2009/0279220 A1  Nov. 12, 2009

(51) Int. Cl.
 *H05K 7/10* (2006.01)

(52) U.S. Cl. ........ 361/770; 361/101; 361/533; 361/540; 361/751; 174/260; 174/267; 257/666; 257/668; 257/690; 257/767; 257/779; 438/113; 438/123

(58) Field of Classification Search .................. 361/770, 361/101, 523, 533, 540, 751; 174/260, 267; 257/690, 666, 668, 767, 779; 438/113, 123
See application file for complete search history.

(56) References Cited

U.S. PATENT DOCUMENTS

| | | | | |
|---|---|---|---|---|
| 4,073,971 A | * | 2/1978 | Yasujima et al. | 427/103 |
| 4,259,676 A | * | 3/1981 | Salmon et al. | 347/209 |
| 4,818,895 A | * | 4/1989 | Kaufman | 327/565 |
| 4,945,445 A | * | 7/1990 | Schmerda et al. | 361/101 |
| 5,028,983 A | * | 7/1991 | Bickford et al. | 257/668 |
| 5,103,283 A | * | 4/1992 | Hite | 257/724 |
| 5,309,014 A | * | 5/1994 | Wilson | 257/584 |
| 5,534,788 A | * | 7/1996 | Smith et al. | 324/771 |
| 5,546,048 A | * | 8/1996 | Sano et al. | 330/263 |
| 5,877,672 A | * | 3/1999 | Tsuda et al. | 338/22 R |
| 6,150,714 A | * | 11/2000 | Andreycak et al. | 257/690 |
| 6,294,826 B1 | * | 9/2001 | Ida et al. | 257/677 |
| 6,300,617 B1 | * | 10/2001 | Daughton et al. | 250/214.1 |
| 6,356,774 B1 | * | 3/2002 | Bernstein et al. | 600/323 |
| 6,473,291 B1 | * | 10/2002 | Stevenson | 361/306.3 |
| 6,903,921 B2 | * | 6/2005 | Ishijima | 361/523 |
| 6,975,503 B2 | * | 12/2005 | Abe et al. | 361/533 |
| 7,332,814 B2 | * | 2/2008 | DeBeer et al. | 257/767 |
| 7,489,022 B2 | * | 2/2009 | Torkington et al. | 257/666 |
| 2003/0045032 A1 | * | 3/2003 | Abe | 438/123 |
| 2004/0046237 A1 | * | 3/2004 | Abe et al. | 257/676 |
| 2007/0278516 A1 | * | 12/2007 | Hashimoto et al. | 257/177 |
| 2008/0186008 A1 | * | 8/2008 | Hirohashi et al. | 323/355 |

* cited by examiner

*Primary Examiner* — Xiaoliang Chen
(74) *Attorney, Agent, or Firm* — Farjami & Farjami LLP

(57) ABSTRACT

An integral impedence is formed on or within a lead frame pin of a semiconductor package and receives a connection from an electrode of a semiconductor die within the package to eliminate the need for adjustment and protective impedences external of the package. The impedence comprises passives such as resistors, capacitors, diodes or inductors which modify the performance of the package for new semiconductor device characteristics. The impedences may have positive or negative temperature coefficients and are in close thermal communication with the semiconductor die.

17 Claims, 5 Drawing Sheets

SEMICONDUCTOR DEVICE PACKAGE WITH INTERNAL DEVICE PROTECTION

BACKGROUND OF THE INVENTION

Modern applications of semiconductor packages have an increasing demand for quick improvements in performance of their electric components and circuits. To keep up with the raising demand of better performance, higher power density, more efficiency, lower cost and space, more integration, higher functionality, increased digital content, etc., the silicon process technologies undergo continuous improvement steps. Correspondingly the technology development cycles of entire silicon process platforms have shrunk dramatically, sometimes with intermediate process upgrades on a yearly time base.

Consequently the market and the applications can take advantage of newer and better performing devices on shorter and shorter time scales. Existing products will be replaced by a next generation part with faster turn-around cycles than ever before. The quick adoption of a better performing silicon (or other semiconductor materials) process technology is advantageous to improve systems like electronic control units as quickly as possible.

On the other hand this quick replacement of existing parts by newer devices can also cause many problems for the system and circuit designs using those parts. Since the design-in of a newer or better performing devices normally requires changes or modifications of the circuit layout or the main system, such as an electronic control unit, unless the new part offers exactly the same layout, package, pin count, electric supply requirements, protective circuits, and the like.

Therefore, it is advantageous to produce a pin-compatible replacement product which provides a better performance (e.g. better electric behavior, higher power, etc.) while the user-application need not be changed. Thus, a printed circuit copper board or the like doesn't need to change its trace layout if the replacement part is in the same package and has the same footprint and layout as the older version.

This is especially important for applications such as automotive applications which do not change hardware generations as frequently as the silicon process technology offers improved parts. If the newer silicon technology offers a better performing device in the same package and with a pin-compatible layout, the application (e.g. an Electronic Control Unit "ECU") can use the newer product without expensive changes of the system design. In that case a re-qualification of the system with the new component is sufficient.

Therefore, in many applications, especially automotive applications, it is preferred to implement a better performing part without sacrificing the existing system layout such as a printed circuit board (PCB). For this purpose it is a major market advantage and of great customer value to generate quasi-identical, pin-compatible replacement parts.

Unfortunately, even if pin-compatibility can be achieved, newer silicon or GaN technology might have different electric characteristics that require changes of the system circuitry even if the package outline and the footprint of the replacement part are identical to the predecessor package. Often the demand for higher integration and more functionality drives a newer silicon generation (especially IC circuits). Therefore, the newer silicon IC generations often implement more logic capabilities (e.g. CMOS logic, digital content, microcontroller capability, memory cells, etc.) which can turn a formerly very rugged and robust IC-process with less "smartness" into a more capable but less rugged device.

Thus, when converting IC or other devices to a more logic capable and higher integrated process, while some functions and parameters are more rugged than in the older process there are also some elements in the new designs that require additional protection or safety features. In such a case a customer who replaces a pin compatible part with a newer part still needs to redesign the application circuit and implement external protecting pre-resistors or other devices or circuits to limit certain current or voltage inputs.

With the need for those additional changes the advantage of a theoretically "pin-compatible" replacement part can be drastically reduced. In some cases a user might even be very reluctant to use it due to the need for additional changes in his system circuitry. In such a case a beneficial drop-in replacement of a newer part will be delayed until the application undergoes a re-design into a newer generation that can add the external protection elements for the newer part. In the automotive market, for example, this generation change is typically linked to car model design cycles which change typically every 3-5 years. This is a major drawback for the quick adaptation of replacement parts with newer silicon or other technology and better performance.

As previously stated, The required protection of sensitive sections or pins of an IC for example may be done with a pre-resistor (or other component) which is mounted externally on a PCB or other circuitry. Similarly, certain circuit blocks and contact pins of parts may need additional pre-resistors when used in the same application as the original part which did not need this resistor.

The disadvantages of this prior art solution are:

a) the user has to implement the changes on his system and carry the cost and time delay for changing the entire system such as a different PCB layout and changes in the assembly process to implement the pre-resistor or other component.

b) if the user is not aware of the need for a pre-resistor he might just replace the older generation part with the newer "pin-compatible" product and cause unaccepted failures in his application.

It would be very advantageous to implement the necessary new protection in a way that a new pin-compatible part does not need external protection.

BRIEF DESCRIPTION OF THE INVENTION

The invention provides a solution for the above described problem of replacement parts that require additional protection compared to the replaced predecessor device. In accordance with the invention, a protecting pre-resistor or other device is integrated into the standard package of the new device without impact on footprint and pin compatibility. For example, a resistor, which may have a well controlled thermal coefficient of resistance may be added to the lead frame pine of the device. The package will then provide the protection needs of the new device without requiring the customer to redesign his circuit to accommodate the new part.

The invention offers the following advantages:

a) The customer has an identical 1:1 replacement of a newer better performing part, without the need for changing his application layout or electric circuit.

b) Cost and space savings as compared to the state of the art solution that requires an additional external passive component (like a pre-resistor) in the circuitry to protect the new replacement part.

c) Quick adoption of newer generation parts without cost and time intensive redesigns at the customer site.

d) Reduced risk of failures due to incorrect application use by the customer.

e) No need for disclosure of certain device weaknesses as compared to the predecessor part by implementing protection "hidden" in the package.

f) Additional functionality available inside of the package such as current sensing or temperature measurement.

g) Automatic adjustment of the protection (e.g. resistor value) with the operating temperature of the device.

The invention can be applied to all types of electric devices that need added protection or current limiter using a pre-resistor or other passive components (such as capacitors, diodes or inductors).

The invention is especially advantageous for markets with quick turn-around cycles or newer product generations such as the consumer and appliance markets, since the newer parts can be implemented without changing the external circuitry. The invention is also beneficial for markets with very slow turn around cycles of the application due to long system lifetimes such as automotive control units since the newer generation devices can be implemented without change of the circuitry design. Thus, only a re-qualification of an existing ECU with the new device may be required.

DETAILED DESCRIPTION OF THE PREFERRED EMBODIMENT

Figure 1:
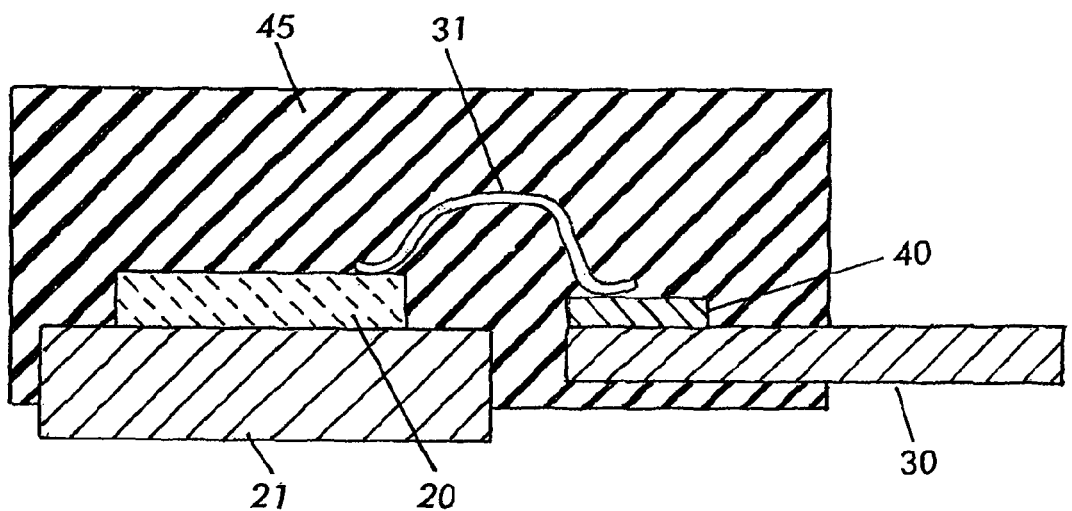
FIG. 1 is a cross sectional view of a first embodiment of the invention in which a pre-resistor is integrated into a lead or pin of the lead frame of an otherwise standard plastic package.

Referring now to the drawings, similar components in each Figure have the same identifying numeral.

Referring first to FIG. 1, there is shown a processed silicon die 20 mounted on a lead frame segment 21.

Die 20 may be an IC or power device such as a MOSFET or IGBT or the like and may include process improvements over the processes used for part which it replaces. The die 20 may have any desired electrode pattern, including for example, electrodes 22, 23, 24 and 25 (FIGS. 2, 3, 5 and 6) depending on the device 20 type.

Lead frame 21 (FIGS. 1, 2, 3, 4, 5 and 6) has a plurality of extending leads or pins, only one of which, lead 30, is shown in FIG. 1. A conventional wire bond 31 bonds electrode 24 to lead 30. Other wire bonds may connect the other electrodes to other lead frame leads or pins (not shown).

In accordance with one embodiment of the invention, and as shown in FIG. 1, a pre-resistor 40 is fixed on lead frame lead 30 and receives the end of bond wire 31. The resistor 40 has the same value as a prior art external resistor used to adapt the new die 20 to an existing application.

Resistor 40 may be a resistive layer, for example, manganese sized to exhibit a predetermined resistance change with temperature (and thus lead current) and is preferably deposited on the lead frame to a size needed to produce the desired resistance value. The resistor 40 may be formed by coating, plating, or sputtering or the like. A bond wire 31 is connected to its upper surface. The resistive metal layer 40 preferably has an upper top layer of, for example, nickel, which will suitably bond to conventional Al or Au bond wire 31 in a conventional wire bond application.

Figure 1A:
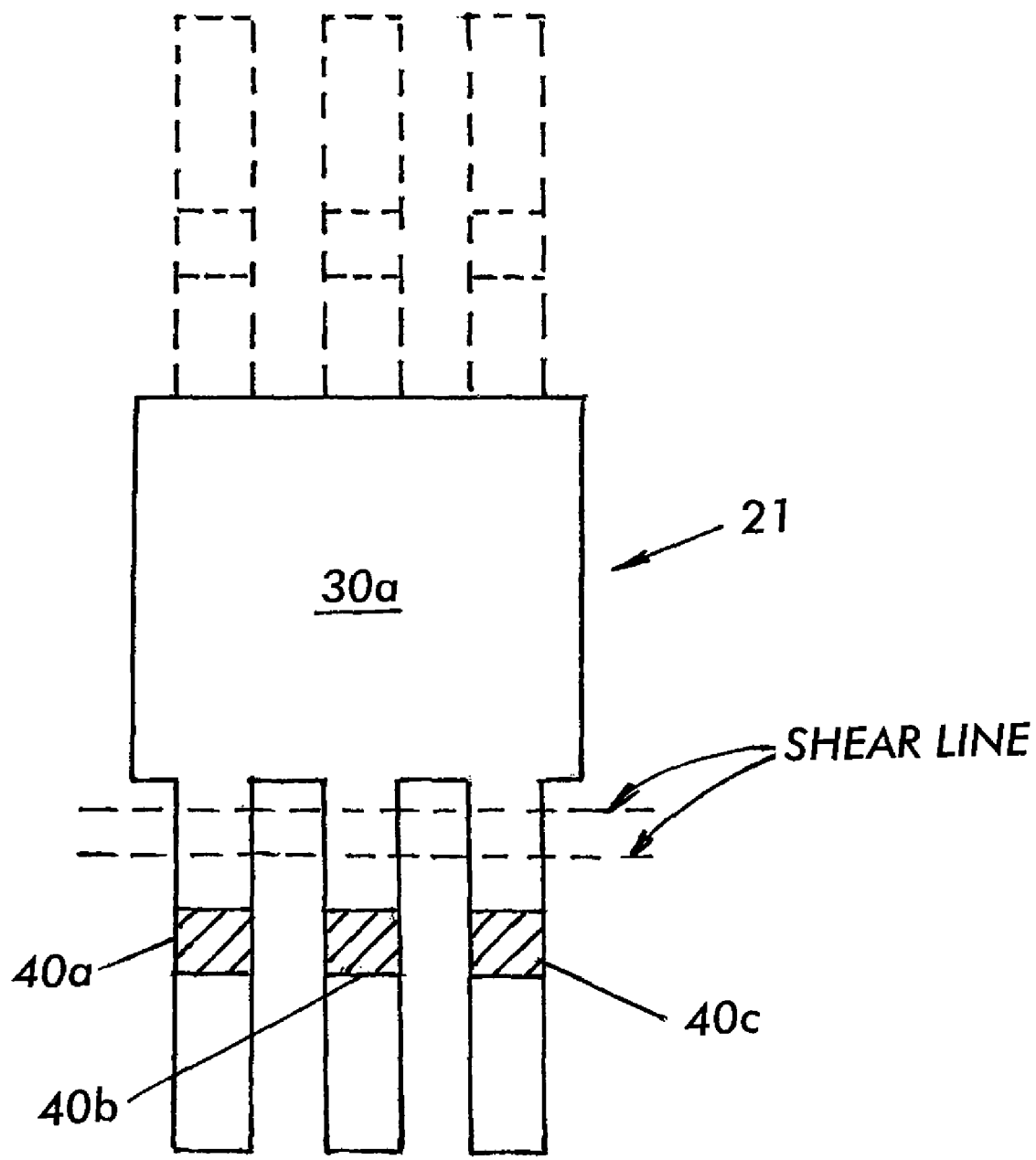
FIG. 1A is a plan view of a full lead frame section.

While only one lead of the lead frame is shown as receiving a pre-resistor, such pre-resistors can also be formed on other leads which are bond-wire connected to other electrodes of die 20, and may have other respective resistive values, as desired. FIG. 1A shows a top view of such a lead frame with plural pre-resistors (or pre impedences) 40a, 40b, and 40c on respective leads or pins extending from the central die support surface 30a which receives die or chip 20.

The package of FIG. 1 is preferably a plastic package and is conventionally overmolded with a suitable plastic housing 45.

Figure 2:
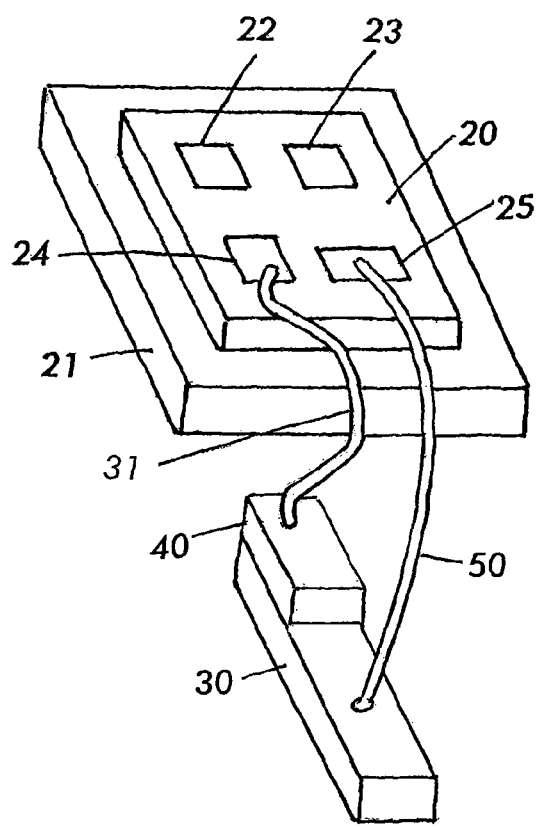
FIG. 2 is a perspective view of the embodiment of FIG. 1 with an added sense bond wire which bypasses the pre-resistor.

Referring next to FIG. 2, which shows the package of FIG. 1 with housing 45 removed for clarity, a sense bond wire 50 added, extending from electrode 25 to lead 30, by passing resistor 40.

The optional bond wire 50 (FIGS. 2, 3 and 5) is a current sense wire bond and permits the measurement of the voltage drop across resistor 40 to determine the current flow through resistor 40. Thus resistor 40 acts as a shunt resistor, permits measurement of the temperature of the device (knowing the temperature co-efficient of the resistive material 40 and the current flow to pin 30).

Figure 3:
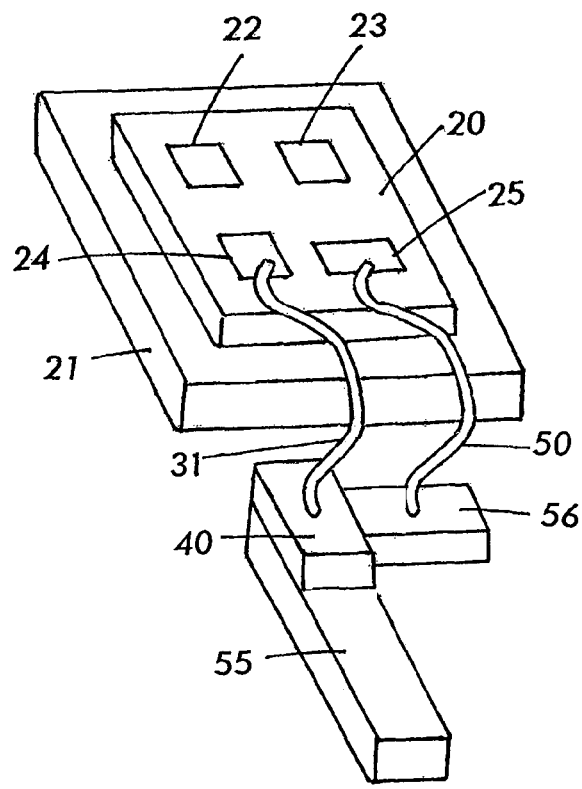
FIG. 3 is a modification of FIG. 2 in which the lead frame pin has a lateral extension to more conveniently receive the sense bond wire.

FIG. 3 shows an embodiment like that of FIG. 2, where however, lead frame segment 55 replaces lead frame segment 30 and has a lateral extension 56 for receiving sense bond wire 50. Significantly, in both FIGS. 2 and 3 sense bond wire 50 is connected close to resistor 40 and is in close thermal communication with resistor 40. As stated previously, the bond wire 50 and bond wire 31 of FIGS. 2 and 3 can be used for temperature sensing measuring the voltage drop over resistor 40.

By knowing the resistor 40 temperature coefficient and the current flow, the device's temperature can be measured via the voltage drop over the resistive layer 40. Again the close proximity of bond wire 50 to the sensor element (resistive layer 40) and a suitable measurement device or circuit in the IC 20 will solve temperature difference problems existing in state-of-the-art solutions using external temperature sensor elements. Thus, temperature drifts during operation are compensated by having close thermal contact between the resistor 40 and the IC 20.

Another advantage of the solution shown in FIGS. 2 and 3 is that the resistive layer material 40 can be chosen with a positive or negative temperature coefficient. Thus, depending what is needed for the device, the value of the resistive layer 40 will change with the operating temperature of the device. Note that the silicon device 20 and the lead frame 21 will have a very similar temperatures due to their close proximity. Therefore, another advantage is provided compared to state of the art external resistors which are not in thermal contact with the device which they protect. The integrated resistive protection layer 40 can automatically change its resistive value depending on the operating temperature of the device. For example, if a device needs a higher pre-resistor value when it is hot the resistive material 40 can be chosen to increase the resistance with temperature and therefore be optimized over a broad temperature range. State-of-the art external resistors can only be optimized at one temperature point and need to cover the worst-case condition.

Other passive elements such as inductors or capacitors may be integrated on the lead frame pin of a device package. For example, a capacitor can be mounted and contacted in a similar way as the resistor 40 shown in the embodiments of FIGS. 2 and 3. Thus, instead of a resistive layer, a capacitive multilayer can be provided on one lead frame pin or between two lead frame pins.

Figure 4:
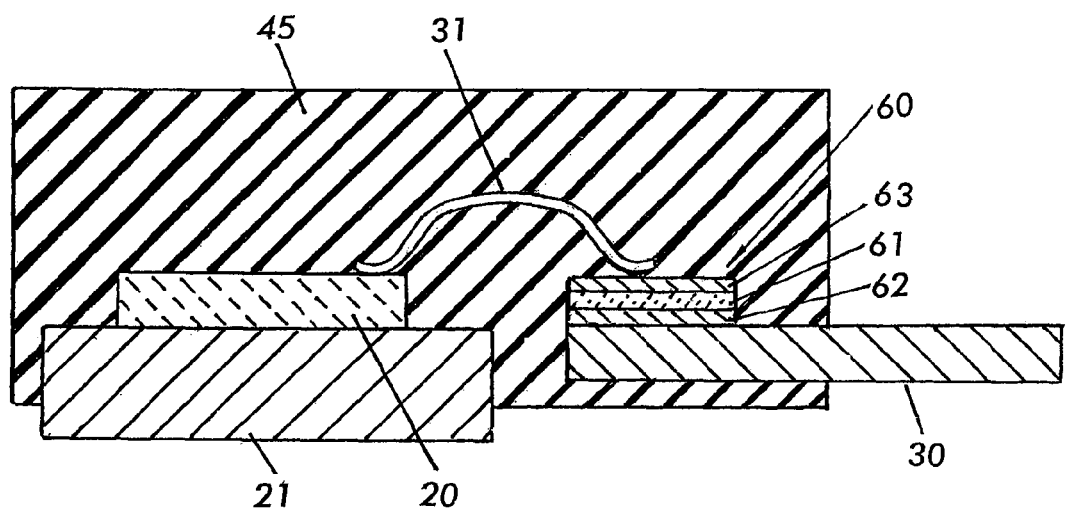
FIG. 4 shows a further embodiment of the invention, like that of FIG. 1 in which a pre-capacitor replaces the pre-resistor of FIG. 1.

Thus, as shown in FIG. 4, the resistor 40 is replaced by capacitor 60 which consists of a dielectric layer 61 between metal contacts 62, 63. Capacitor 60 may be used as an isolating input element for decoupling pin 30 from the external circuit. Wire bond 31 is connected to top metal 63. Metal 63 or a suitable plating is chosen to be conventionally bonded to aluminum or gold wires.

Figure 5:
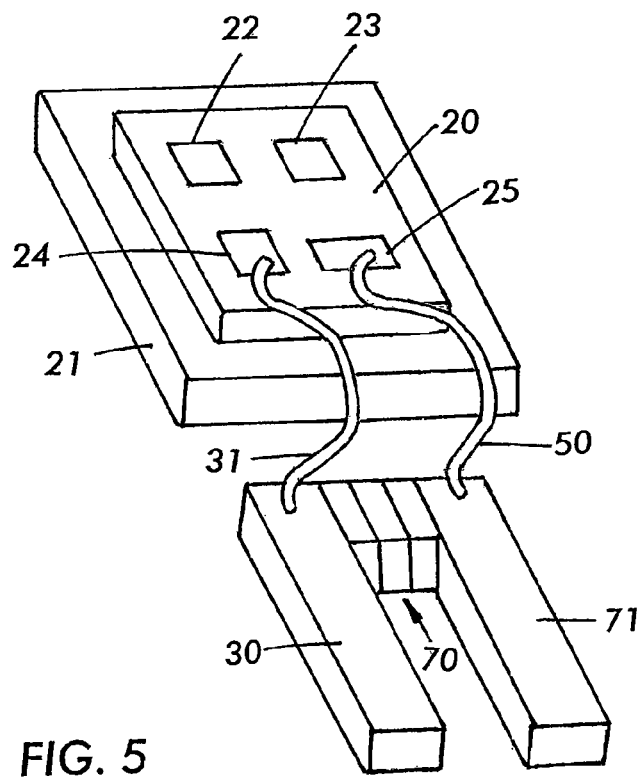
FIG. 5 shows a further embodiment of the invention, like that of FIG. 2 in which two adjacent lead frame pins have capacitive stack to enable measurement of current or temperature.

FIG. 5 shows a further embodiment of the invention in which a capacitive stack 70 is connected between lead frame pins 30 and 71 for purposes previously described. Notes that stack 70 can also be a resistive stack of layers of Cu, Mo and Cu which is soldered, sintered, welded or otherwise formed.

Figure 6:
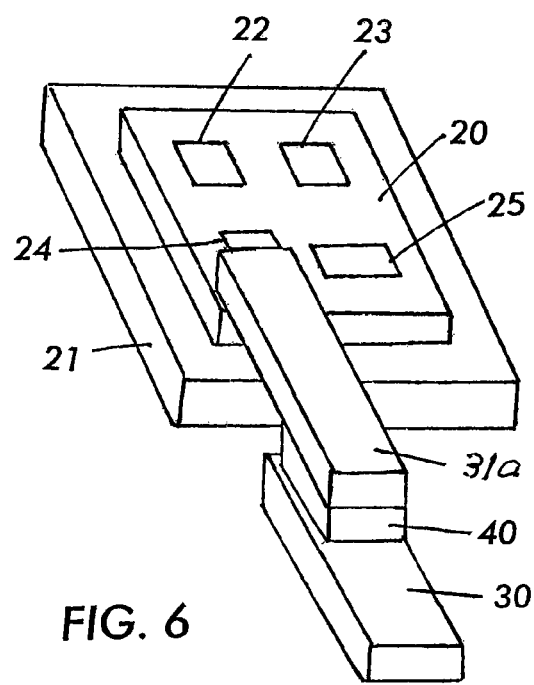
FIG. 6 shows a further embodiment of the invention in which the bond wire of FIG. 2 is replaced by a rigid lead frame segment to form a bond-wireless package.

FIG. 6 shows a still further embodiment of the invention in which bond wire 31 of FIG. 1, for example, is replaced by a more rigid lead frame type copper strip 31a to connect resistive layer 40 to electrode 24 form a bond-wireless package. Note that resistor 40 could be replaced in FIG. 6 by a capacitor or inductive part.

Figure 7:
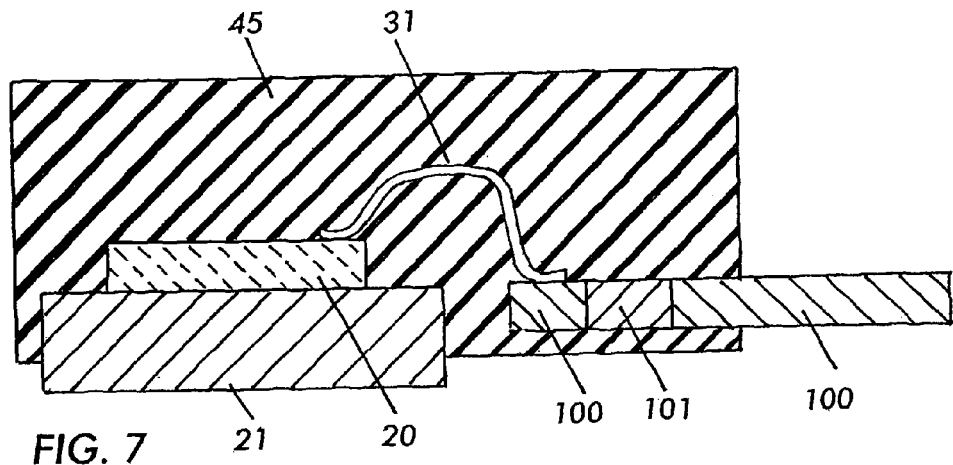
FIG. 7 shows a further embodiment of the invention in which the lead or pin of FIG. 1 contains a series pre-resistor.

FIG. 7 shows a still further embodiment of the invention in which lead 30 of FIG. 1 is replaced by composite lead 100 in which a resistive element 101 of manganese or the like is formed within and along the length of the lead. The bond wire 31 is fixed or wire-bonded to conductive (copper) segment 102 of the lead 100.

Figure 8:
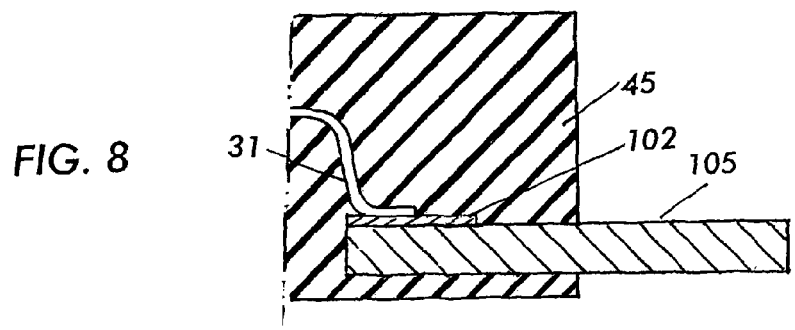
FIG. 8 shows a further embodiment of the invention in which the full lead frame pin is of resistive material.

As shown in FIG. 8 it is also possible to make the full length of lead 105 of resistive material (manganese) with a wire bond 31 connected to a suitable plated segment 106 which may be nickel or the like.

Figure 9A:
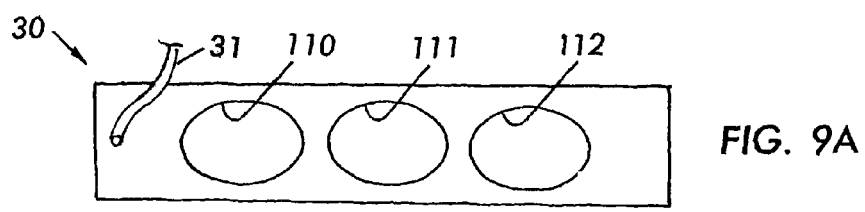
FIGS. 9A, 9B and 9C are top views of lead frame pins which are shaped to define an increased resistance as required by the pre-resistor of FIG. 1.
Figure 9B:
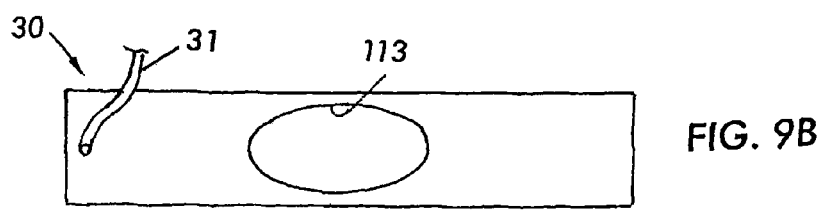
Figure 9C:
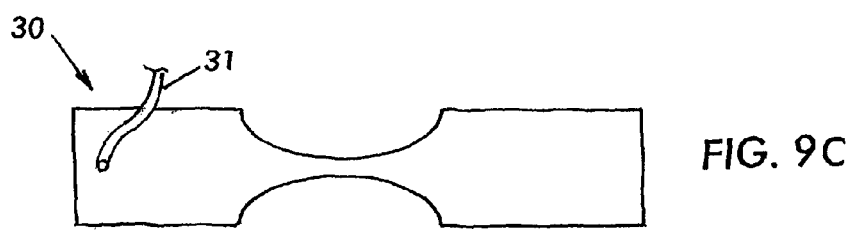

FIGS. 9A, 9B and 9c show techniques for increasing the resistance of lead 30 without the need for a separate resistor 40 of FIG. 1. Thus, in FIG. 9A, a pattern of spaced openings 110, 111, 112 is formed along the length of lead 30. In FIG. 9B an elongated slot 113 is employed for the same purpose. Finally, in FIG. 9C, side cut-outs 114, 115 form a controlled increased pre-resistor value in the lead 30. The special shaping of the lead 30 is advantageous for introducing relatively small resistance values or for AC current resistance which takes advantage of skin effect at higher frequencies.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A semiconductor package comprising a semiconductor chip; a flat conductive support for receiving on side of said semiconductor chip; at least one electrode in the opposite side of said chip; at least one elongated lead which is generally coplanar with said flat conductive support; an impedance element fixed on top of said elongated lead for adjusting for a characteristic of said semiconductor chip; and a connector having one end connected to said at least one electrode and its opposite end connected in series with said impedance element and said elongated lead, wherein said connector is connected without bond-wires.

2. The semiconductor package of claim 1, wherein said semiconductor chip is an IC having a plurality of electrodes on its said opposite side.

3. The semiconductor package of claim 1, wherein said semiconductor chip is a power electronics switching device.

4. The semiconductor package of claim 1, which further includes a plastic housing enclosing said semiconductor chip, said connector and said impedance element; an end portion of said at least one elongated lead and a portion of said flat conductor support extending through the surface of said plastic housing to be accessible for connection to external circuits.

5. The semiconductor package of claim 1, wherein said flat conductor support and said at least one elongated lead are elements of a common lead frame.

6. The semiconductor package of claim 1, wherein said opposite end of said connector is connected directly to said impedance element.

7. The semiconductor package of claim 1, wherein said opposite end of said connector is connected directly to said elongated lead.

8. The semiconductor package of claim 1, wherein said impedance element is a resistor plated onto a surface of said elongated lead.

9. The semiconductor package of claim 8, wherein said opposite end of said connector is connected directly to said impedance element.

10. The semiconductor package of claim 1, wherein said impedance element is a resistor formed within the body of the length of said elongated lead.

11. The semiconductor package of claim 10, wherein said opposite end of said connector is connected directly to said elongated lead.

12. The semiconductor package of claim 1, wherein said impedance element comprises a capacitor fixed atop a portion of the surface of said elongated lead.

13. The semiconductor package of claim 1, wherein said semiconductor chip has a second electrode on its said opposite side and a current sense lead extending from and connecting said second electrode to said elongated lead and by passing said impedance element.

14. The semiconductor package of claim 6, wherein said semiconductor chip has a second electrode on its said opposite side and a current sense lead extending from and connecting said second electrode to said elongated lead and by-passing said impedance element.

15. The semiconductor package of claim 12, wherein said semiconductor chip has a second electrode on its said opposite side and a current sense lead extending from and connecting said second electrode to said elongated lead and by-passing said impedance element.

16. The semiconductor package of claim 8, wherein said resistor has a predetermined intentional thermal coefficient of resistance.

17. The semiconductor package of claim 10, wherein said resistor has a predetermined intentional thermal coefficient of resistance.

\* \* \* \* \*